United States Patent
Kakoschke et al.

(10) Patent No.: US 9,390,975 B2
(45) Date of Patent: *Jul. 12, 2016

(54) METHODS FOR PRODUCING A TUNNEL FIELD-EFFECT TRANSISTOR

(71) Applicant: Infineon Technologies AG, Neubiberg (DE)

(72) Inventors: Ronald Kakoschke, Munich (DE); Helmut Horst Tews, Poughkeepsie, NY (US)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/591,228

(22) Filed: Jan. 7, 2015

(65) Prior Publication Data

US 2015/0140770 A1 May 21, 2015

Related U.S. Application Data

(62) Division of application No. 13/957,277, filed on Aug. 1, 2013, now Pat. No. 8,946,037, which is a division of application No. 13/081,180, filed on Apr. 6, 2011, now Pat. No. 8,518,776, which is a division of application No. 11/814,364, filed as application No. PCT/EP2005/056641 on Dec. 9, 2005, now Pat. No. 7,943,973.

(30) Foreign Application Priority Data

Jan. 20, 2005 (DE) .......................... 10 2005 002 739

(51) Int. Cl.
*H01L 21/8234* (2006.01)
*H01L 29/73* (2006.01)
*H01L 21/28* (2006.01)
*H01L 27/088* (2006.01)
*H01L 29/66* (2006.01)
*H01L 29/78* (2006.01)

(52) U.S. Cl.
CPC .... *H01L 21/823418* (2013.01); *H01L 21/2815* (2013.01); *H01L 27/088* (2013.01); *H01L 29/665* (2013.01); *H01L 29/66545* (2013.01); *H01L 29/66553* (2013.01); *H01L 29/66628* (2013.01); *H01L 29/66659* (2013.01); *H01L 29/7311* (2013.01); *H01L 29/78* (2013.01); *H01L 29/7835* (2013.01)

(58) Field of Classification Search
CPC ..................... H01L 29/7311; H01L 29/66545; H01L 21/2815; H01L 21/823418
See application file for complete search history.

(56) References Cited

U.S. PATENT DOCUMENTS

| | | |
|---|---|---|
| 4,318,117 A | 3/1982 | Suzuki et al. |
| 4,419,809 A | 12/1983 | Riseman et al. |
| 5,489,543 A | 2/1996 | Hong |

(Continued)

OTHER PUBLICATIONS

Aydin, C., et al., "Lateral interband tunneling transistor in silicon-on-insulator," Applied Physics Letters vol. 84, No. 10, Mar. 8, 2004, pp. 1780-1782.

(Continued)

*Primary Examiner* — Joseph C Nicely
(74) *Attorney, Agent, or Firm* — Slater Matsil, LLP

(57) ABSTRACT

A method for producing a tunnel field-effect transistor is disclosed. Connection regions of different doping types are produced by means of self-aligning implantation methods.

11 Claims, 3 Drawing Sheets

(56) References Cited

U.S. PATENT DOCUMENTS

| | | |
|---|---|---|
| 5,600,168 A | 2/1997 | Lee |
| 5,896,314 A | 4/1999 | Chen |
| 5,960,270 A | 9/1999 | Misra et al. |
| 6,051,470 A | 4/2000 | An et al. |
| 6,087,208 A | 7/2000 | Krivokapic et al. |
| 6,214,677 B1 * | 4/2001 | Lee ............... H01L 21/2815 257/E21.444 |
| 6,251,760 B1 | 6/2001 | Son |
| 6,482,724 B1 | 11/2002 | Chatterjee |
| 6,661,066 B2 | 12/2003 | Kuroi et al. |
| 6,770,532 B2 | 8/2004 | Chuang et al. |
| 6,844,587 B2 | 1/2005 | Kang |
| 6,927,131 B2 | 8/2005 | Kim |
| 6,998,318 B2 | 2/2006 | Park |
| 7,109,553 B2 | 9/2006 | Matsumoto et al. |
| 7,256,444 B2 | 8/2007 | Choi et al. |
| 7,355,218 B2 | 4/2008 | Schnabel et al. |
| 7,517,757 B2 | 4/2009 | Min et al. |
| 8,946,037 B2 * | 2/2015 | Kakoschke ......... H01L 21/2815 257/E21.619 |
| 2002/0024849 A1 | 2/2002 | Kato et al. |
| 2002/0037619 A1 | 3/2002 | Sugihara et al. |
| 2003/0022442 A1 | 1/2003 | Cho et al. |
| 2003/0137001 A1 | 7/2003 | Chan et al. |
| 2003/0157770 A1 | 8/2003 | Chu et al. |
| 2004/0014262 A1 | 1/2004 | Manabe |
| 2004/0246803 A1 | 12/2004 | Sugiyama et al. |
| 2005/0067659 A1 | 3/2005 | Gutsche et al. |
| 2006/0008984 A1 | 1/2006 | Jeon et al. |
| 2006/0258072 A1 | 11/2006 | Kavalieros et al. |
| 2007/0001234 A1 | 1/2007 | Kong |
| 2008/0068895 A1 | 3/2008 | Kakoschke et al. |
| 2009/0310427 A1 | 12/2009 | Park et al. |
| 2010/0155814 A1 | 6/2010 | Sato et al. |

OTHER PUBLICATIONS

Fischer, W., "Field Induced Tunnel Diode," IBM Technical Disclosure Bulletin, 1973, 3 pages.

Hansch, W., et al., "A vertical MOS-gated Esaki tunneling transistor in silicon," Thin Solid Films 369 (2000), pp. 387-389, Elsevier.

Nirschl, Th., et al., "The Tunneling Field Effect Transistor (TFET) as an Add-on for Ultra-Low-Voltage Analog and Digital Processes," IEEE 0-7803-8684, Jan. 2004, 4 pages.

Reddick, W.M., et al., "Silicon surface tunnel transistor," Appl. Phys. Lett. 67 (4), American Institute of Physics, Jul. 24, 1995, pp. 494-496.

Wang, P-F., et al., "Complementary tunneling transistor for low power application," Solid-State Electronics, 2004, pp. 2281-2286, Elsevier.

Wang, P-F., et al., "Simulation of the Esaki-tunneling FET," Solid-State Electronics SSE 3430, Feb. 4, 2003; 6 pages, Elsevier.

* cited by examiner

METHODS FOR PRODUCING A TUNNEL FIELD-EFFECT TRANSISTOR

This application is a continuation of U.S. patent application Ser. No. 13/957,277 filed on Aug. 1, 2013, which is a divisional of U.S. patent application Ser. No. 13/081,180 filed on Apr. 6, 2011 and issued as U.S. Pat. No. 8,518,776, which is a divisional of U.S. patent application Ser. No. 11/814,364, which was filed on Jul. 28, 2008 and issued as U.S. Pat. No. 7,943,973, which is a national stage entry of International Application PCT/EP2005/056641 filed on Dec. 9, 2005, which claimed priority to German Application 10 2005 002 739.3 filed on Jan. 20, 2005, all of these applications are incorporated herein by reference.

TECHNICAL FIELD

The present invention relates generally to semiconductor devices, and more particularly to method for producing a tunnel field-effect transistor.

SUMMARY OF THE INVENTION

The invention relates, inter alia, to a method for producing a field-effect transistor, in particular a tunnel field-effect transistor. The following steps are carried out in the method, without any restriction by the order in which the method steps are listed. A substrate is provided on which an auxiliary layer is arranged. The auxiliary layer is patterned by removing material of the auxiliary layer so as to produce at least one auxiliary region. A first spacer element is produced in a region in which material of the auxiliary layer has been removed. Using the first spacer element and the auxiliary region as a mask, a first connection region of a field-effect transistor is doped. The first connection region is covered with a covering material or a covering layer.

The substrate is a monocrystalline semiconductor substrate, for example, in particular monocrystalline silicon. SOI substrates (silicon on insulator) are particularly suitable. The auxiliary layer comprises for example a different material than the substrate or the same material. Auxiliary layers composed of polycrystalline silicon are often used, from which gate electrodes of the transistor can be produced.

The spacer element is also referred to as a spacer and defines a distance between the connection region and a channel forming region in the substrate. The connection regions are usually also referred to as source/drain regions and can optionally contain so-called extension regions or extensions, for example so-called LDD zones (lightly doped drain), that is to say regions of the same doping type as the adjoining connection region but with a lower dopant concentration. When producing field-effect transistors having connection regions of the same doping type, the gate electrode or the auxiliary region and also the spacer elements serve as a mask when doping the first connection region.

On the other hand, there are, however, tunnel field-effect transistors in which the connection regions have mutually different doping types. In this case, when doping one connection region, the respective other connection region could be covered with a resist mask that is patterned with the aid of a photolithographic step in such a way that its edge lies on the auxiliary region. In this case, the doping of the connection region remains self-aligning despite the use of the resist.

It is an object of the invention to specify a simple method for producing a field-effect transistor, in particular a tunnel field-effect transistor, which makes it possible, in particular, to produce field-effect transistors having small lateral dimensions. Moreover, the intention is to specify a field-effect transistor and an integrated circuit arrangement.

The object relating to the method is achieved by means of a method having the method steps specified in patent claim 1. Developments are specified in the subclaims.

The invention is based on the consideration that it is possible to produce tunnel field-effect transistors having dimensions of less than 50 nm (nanometers) and in particular within the range of 15 nm to 30 nm, without short channel effects (SCE) occurring, which impair the electrical functional properties of the tunnel field-effect transistor.

Therefore, in the method according to the invention, the following method steps are carried out in addition to the method steps mentioned in the introduction. The material of the auxiliary region is removed. A second spacer element is produced in a region in which material of the auxiliary region has been removed. Using the second spacer element and the covering material as a mask, a second connection region of the field-effect transistor is doped.

Accordingly, in the method according to the invention, the material of the auxiliary region is again removed completely or at the very least partially, such that the resultant space can be used for a spacer element. This makes it possible to produce field-effect transistors having very small lateral dimensions.

In the method according to the invention, the covering material or the covering layer is a layer that is planarized by means of a CMP method (chemical mechanical polishing), for example. The method according to the invention makes it possible to dope the connection regions without having to use a photolithographic step in which an edge of the photomask lies within the zone in which the transistor is to be produced. However, photomasks can be used in order to select, on the integrated circuit arrangement, regions in which a specific type of transistors is to be produced.

In one development of the method according to the invention, the auxiliary layer is firstly patterned by means of a photolithographic method, a projection having two sidewalls facing away from one another or a trench having two sidewalls facing one another arising. In a plane lying at an angle of 90 degrees with respect to a plane in which the substrate is arranged, the projection has for example a rectangular cross section or a trapezoidal cross section, sidewalls of the trapezoid being inclined symmetrically with respect to one another. In said plane, the trench likewise has a rectangular cross section or a trapezoidal cross section, in which case the trench width can decrease as the depth increases. In one configuration, the lateral dimension of the projection or of the trench is less than 500 nm, or less than 250 nm or even less than 100 nm. In this case, the lateral dimension is given, for example, by the smallest lateral feature size that can be achieved by the lithography method used.

In a next development of the method according to the invention, a control region of the field-effect transistor is produced after the removal of material of the auxiliary region or during the removal of material of the auxiliary region. The method steps performed in this case are explained in more detail below with reference to FIGS. 3 and 6.

In an alternative development, a control region of the field-effect transistor is produced before the production of the first spacer element on the projection or in the trench. Method steps performed in this case are explained in more detail below with reference to FIGS. 5 and 7.

Consequently, there are a large number of possibilities for carrying out the method according to the invention. One or other of said possibilities has particular technical effects depending on the other production steps required. The large number of possibilities enables more degrees of freedom in the production.

In a next development of the method, no extension regions, that is to say no LDD regions or so-called extensions, are produced on the connection regions or on the source/drain regions. In the case of tunnel field-effect transistors, a steep dopant concentration gradient brought about or promoted by the absence of the extension region at the tunnel junction promotes the commencement of the tunnel and hence a control effect that is as large as possible. In an alternative development, an extension region is produced on one connection region, but not on the other connection region, in particular not on the connection region at which tunneling occurs.

In a next development of the method, only one connection region is silicided. A siliciding on the other connection region is suppressed. By virtue of this measure, in the case of tunnel field-effect transistors it is likewise possible to achieve an improvement of the electrical properties of the transistor. The non-silicided connection region is, in particular, the connection region at which tunneling takes place.

The invention additionally relates to an integrated tunnel field-effect transistor containing the following elements. A preferably semiconducting channel forming region, which is undoped, i.e. intrinsically doped, or doped comparatively lightly in comparison with other regions of the transistor. The channel forming region is preferably formed in monocrystalline material. A preferably semiconducting first doped connection region (source/drain region), which is doped in accordance with a first doping type and with a greater dopant concentration than the channel forming region. A preferably semiconducting second doped connection region, which is doped in accordance with a different doping type than the first connection region and with a greater dopant concentration than the channel forming region. By way of example, the first connection region is heavily p-doped and the second connection region is heavily n-doped. As an alternative, the first connection region is heavily n-doped and the second connection region is heavily p-doped. The dopant concentration in the connection region at which tunneling is intended to occur is, in particular, greater than $10^{19}$ or even greater than $10^{20}$ dopant atoms per $cm^3$. Moreover, the connection regions, and if appropriate, the extension regions are preferably formed in a monocrystalline material. The channel forming region is arranged between the first connection region and the second connection region. A control region, also referred to as a gate. An electrically insulating insulation region arranged between the control region and the channel forming region.

The tunnel field-effect transistor according to the invention has a minimum lateral extent of the control region at the insulation region of less than 50 nm or even less than 30 nm. In particular, however, the lateral extent is greater than 5 nm or greater than 10 nm. The tunnel field-effect transistor according to the invention can be produced by the method according to the invention, for example, such that the technical effects mentioned above are applicable.

In one development of the field-effect transistor, the field-effect transistor has an asymmetrical construction, which has likewise been brought about for example by the use of the method according to the invention. In a next development, the asymmetry is manifested in the fact that the control region has a sidewall that lies vertically with respect to a plane in which the insulating layer lies. By contrast, a sidewall of the control region that faces away from said sidewall is convex, i.e. outwardly bulging. In the case of control regions having exclusively vertical sidewalls, the asymmetry arises, for example, by means of spacers of different heights on sides of the gate region that face away from one another.

The invention additionally relates to an integrated circuit arrangement containing at least two tunnel field-effect transistors according to the invention or, alongside at least one tunnel field-effect transistor according to the invention, also at least one further field-effect transistor which has connection regions of the same doping type but which for the rest has the same construction as the tunnel field-effect transistor according to the invention. The further field-effect transistor is therefore not a tunnel field-effect transistor. Furthermore, the integrated circuit arrangement can additionally also contain planar tunnel field-effect transistors in which the control regions have been patterned by a lithographic method rather than by a sublithographic method.

BRIEF DESCRIPTION OF THE DRAWINGS

Exemplary embodiments of the invention are explained below with reference to the accompanying drawings, in which.

DETAILED DESCRIPTION OF ILLUSTRATIVE EMBODIMENTS

Figure 1:
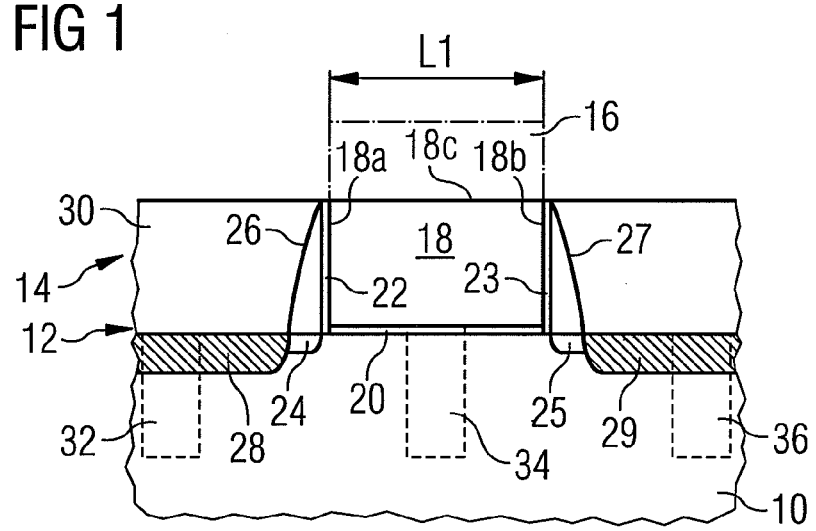
FIGS. 1 to 4 show production stages in the production of tunnel field-effect transistors in accordance with a first exemplary embodiment, in which a projection is produced at whose location gate regions are produced.

FIGS. 1 to 4 show production stages in the production of tunnel field-effect transistors T1 and T2 in accordance with a first exemplary embodiment. As is illustrated in FIG. 1, a monocrystalline semiconductor substrate 10, for example a silicon wafer, is taken as a starting point. The wafer surface is prepared, e.g., by cleaning. Isolation zones between adjacent transistors are subsequently produced, for example by the use of the LOCOS method (LOCal Oxidation) or by the use of shallow isolation trenches. As is shown in FIG. 1, shallow isolation trenches 32, 34 and 36 can be produced for separation between individual transistors T1, T2 of the integrated circuit arrangement. The isolation trenches 32 to 36 have for example a depth of 200 nm or of greater than 200 nm. The isolation trenches 32 to 36 are filled with silicon dioxide, for example. The isolation trench 34, for example, also makes it possible to achieve, in all the exemplary embodiments, a separation of the drain/source regions lying between the transistors produced in pairs, see e.g., drain/source region for the transistors T1 and T2.

Figure 2:
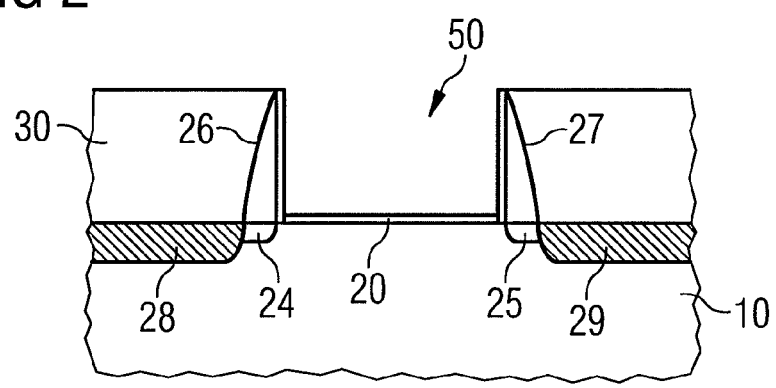

Channel implantations ensue, for example, by means of which, in particular, threshold voltages of the transistors are also predetermined. An insulating layer 12 is subsequently applied, which can be used as gate dielectric, for example by thermal oxidation. FIG. 2;

After the application of the insulating layer 12, an auxiliary layer 14 is applied, for example composed of polycrystalline silicon. The thickness of the insulating layer 12 is for example only 2 nm (nanometers) or is less than 2 nm. The thickness of the auxiliary layer 14 is for example 50 nm or less. A resist is subsequently applied for example a photoresist. The resist is exposed and developed by means of a photolithographic method, a resist region 16 remaining which has a lateral extent L1 of for example 150 nm (nanometers) or less. The auxiliary layer 14 is patterned with the aid of the resist region, an auxiliary region 18 arising. The insulating layer 12 is also patterned at the same time or at a later point in time. During the patterning of the auxiliary layer 14, the process stops on the substrate 10 or on the insulating layer 12. Auxiliary regions 18 in other parts of the circuit arrangement are used for example as gate electrodes of planar CMOS field-effect transistors with connection regions having the same type of doping. The patterning of the auxiliary layer 14 is carried out for example by means of an anisotropic etching method, for example by means of an RIE method (Reactive Ion Etching). Optionally, a so-called trimming process can be carried out in which the lateral extent L1 of the auxiliary regions 18 is reduced further by means of an isotropic etching for example.

The process steps explained above are performed equally for all types of transistors on the integrated circuit arrangement, that is to say for transistors having a large gate length (i.e. larger than sublithographic), for CMOS transistors (Complementary Metal Oxide Semiconductor) having a sublithographic gate length, and for tunnel field-effect transistors. In other exemplary embodiments, however, the integrated circuit arrangement contains only one or more but not all of the types of transistors mentioned.

As is illustrated in FIG. 1, the auxiliary region 18 is laterally delimited by sidewalls 18a and 18b. The auxiliary region 18 is terminated toward the top by a top face 18c. The bottom of the auxiliary region 18 lies on an insulating layer region 20.

As is further illustrated in FIG. 1, after the patterning of the auxiliary region 18, optional sidewall insulations are produced on the lateral faces 18a and 18b of said auxiliary region, for example sidewall oxides 22 and 23, for example by thermal oxidation. The sidewall insulations or sidewall oxides 22 and 23 are produced particularly on those transistors on which so-called extensions are required in order to provide one more degree of freedom. By way of example, the sidewall oxides can also eliminate damage to the gate oxide caused by the patterning of the gate oxide. By means of a subsequent implantation step, the extension regions 24 and 25 are produced using the sidewall oxides 22, 23 and the auxiliary region 18 as a mask.

After the production of the extension regions 24, 25 or directly after the patterning of the auxiliary region 18, spacers 26, 27 are produced on the sides of the sidewall oxides or on the sides of the auxiliary region 18. For this purpose, a layer is deposited with a layer thickness corresponding to the later width of the spacers 26, 27. The spacers 26 and 27 are then produced by anisotropic etching back. By way of example, the spacers 26, 27 comprise silicon nitride. However, other materials are also possible.

After the production of the spacers 26, 27, source and drain implantations are carried out in order to produce drain/source regions 28, 29, a higher implantation energy and also a higher dose than when producing the extension regions 24, 25 being used. Resist masks can be used to select regions in which the drain/source regions are intended to be n-doped or other regions in which they are intended to p-doped. However, the implantation is effected in self-aligning fashion at the spacers 26, 27.

The method steps explained above can also be carried out equally for CMOS transistors having large gate lengths, for CMOS transistors having ultra short gate lengths and for tunnel transistors. In the exemplary embodiment, the width of the sidewall oxides 22, 23 is for example 5 nm (nanometers) or less. The width of the spacers 26, 27 is for example 10 nm or less.

As is furthermore illustrated in FIG. 1, after the implantation of the drain/source regions 28, 29, filling material 30 is deposited over the whole area and planarized, for example with the aid of a CMP method. The CMP method stops e.g. on the auxiliary region 18.

In the exemplary embodiment, BSG (BoroSilicate Glass), for example, is used as material of the filling layer 30. Other exemplary embodiments, however, use other materials for the filling layer 30 which can be etched in particular selectively with respect to polycrystalline silicon, with respect to silicon dioxide and with respect to silicon nitride.

As is illustrated in FIG. 2, regions in which CMOS transistors or tunnel transistors having ultra short gate lengths are intended to be produced are subsequently selected for example optionally with the aid of a photolithographic process. In these regions, the auxiliary region 18 is completely removed, etching being effected selectively with respect to the filling material 30 and with respect to the spacers 26, 27 or with respect to the sidewall oxide 22, 23. The insulating layer region 20 remains at the bottom of a cut-out 50, which arises where the auxiliary region 18 was arranged. If appropriate, however, the insulating layer region 20 can be produced anew by a thermal oxidation. The etch can take place as a selective wet etching process or as a selective dry etch. In the case of a wet etch, high selectivities are achieved e.g. by means of NaOH (sodium hydroxide) diluted in $H_2O$ (water).

Figure 3:
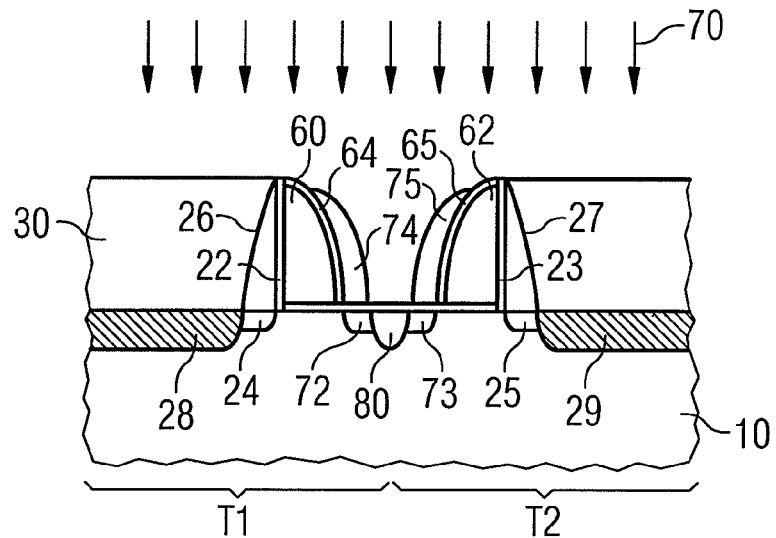

As is furthermore illustrated in FIG. 3, a layer composed of gate material is subsequently deposited, for example a polycrystalline layer. The thickness of said layer defines the width of gate regions 60, 62 which arise after an anisotropic etching-back process on the sidewalls of the cut-out 50. In the exemplary embodiment, the layer thickness is e.g. 20 nanometers. After the anisotropic etching-back process, a sidewall oxidation is optionally carried out in order to produce sidewall oxides 64 and 65 on the uncovered lateral faces of the gate regions 60, 62. As an alternative, first sidewall spacers 64, 65 are produced by layer deposition and anisotropic etching back. If extension regions 72, 73 are required, they are produced with the aid of a self-aligning implantation 70, the sidewall oxides 64, 65, the gate regions 60, 62 and the filling layer 30 serving as a mask. During the implantation, resist masks are optionally used, however, in order to define regions in which transistors that are intended to have n-type extension regions, for example, are located and regions in which transistors that are intended to have p-type extension regions are located.

As is furthermore illustrated in FIG. 3, spacers 74, 75 are subsequently produced on the sidewall oxides 64 and 65, respectively, or directly on the gate regions 60, 62, a layer deposition and an anisotropic etching-back step being used. The spacers 74 and 75 comprise silicon nitride, for example. Drain/source regions 80 are subsequently implanted, the spacers 74, 75, the gate regions 60, 62 and the filling layer 30 serving as a mask. The implantation is self-aligning within a transistor. With the aid of optional photolithographic processes, however, regions on the integrated circuit arrangement can be selected in which, by way of example, n+ source/drain implantations are intended to be carried out or in which, alternatively, p+ source/drain implantations are intended to take place.

Figure 4:
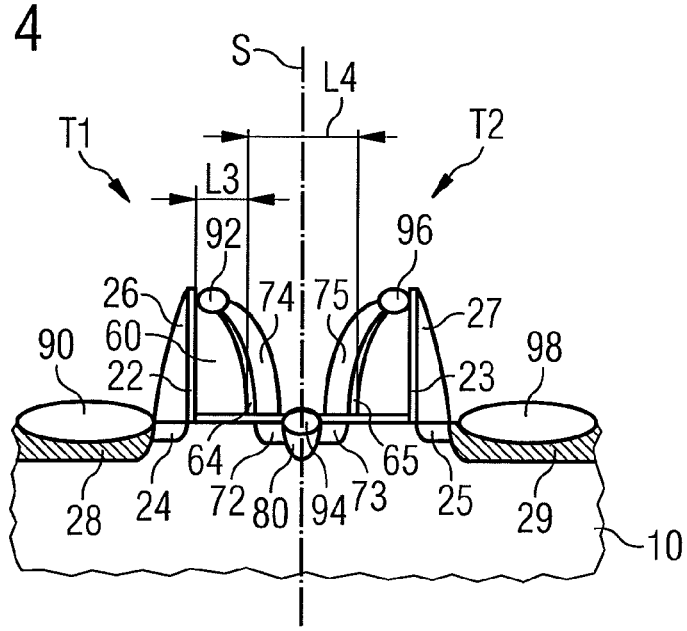

As is further illustrated in FIG. 4, oxide on the gate regions 60, 62 is removed for example with the aid of a wet etch or with the aid of a dry etch. The filling layer 30, too, is optionally removed. With the aid of an optional known salicide method (self-aligned silicide), silicide regions 90, 92, 94, 96, 98 are subsequently produced on the drain/source regions 28, 29, on the gate regions 60, 62 and on the drain/source region 80. If the filling layer 30 remains, then contacts to the connection regions are introduced into the filling layer.

The formation of the silicide region 94 between the two spacers 74, 75 is suppressed in an alternative method implementation, for example by whole-area deposition and etching-back of an auxiliary layer. The selectivity of an etch is utilized as an alternative. The gate insulation is nitrided, for example, that is to say that it has a nitrogen-rich top face. Use is also made of gate insulation layer stacks in which a top silicon nitride layer is present. Silicon nitride has a different etching rate than oxide both during a wet etch and during a dry etch, so that the silicon oxide on the gate regions 60, 62 can be removed without removing the gate dielectric between the gate regions 60, 62. This means that no silicide can then be formed between the two gate regions 60 and 62.

In an alternative method implementation, so-called raised source/drain regions are produced by introducing another selective epitaxy, for example.

By means of an additional trimming process, using e.g. a lithographic method and/or a spacer technique, the gate regions 60 and 62 are separated from one another on the sides of the cut-out 50 which lie opposite one another and which are not illustrated in FIG. 4.

In another exemplary embodiment, a cover layer e.g. composed of silicon nitride is applied to the as yet unpatterned auxiliary layer 14. The cover layer and the auxiliary layer 14 are then patterned jointly, an auxiliary region being produced which corresponds to the auxiliary region 18 and which is completely covered by a region of the cover layer. The steps for producing optional sidewall oxides, optional extension regions, spacers and connection regions as explained with reference to FIG. 1 are then carried out. Prior to the application of a layer corresponding to the filling layer 30, the prepatterned cover layer region is etched back isotropically, so that edge regions of the auxiliary region corresponding to the auxiliary region 18 are uncovered, but the auxiliary region is still covered with the etched-back cover layer region in a central part. A similar etching-back process is explained below with reference to FIG. 6 for a cover layer 221. A layer corresponding to the filling layer 30 is then applied and planarized, the process stopping e.g. upon reaching the residual cover layer region. The filling layer then still covers the edge regions of the auxiliary region that were uncovered during the isotropic etching back. The cover layer region is then removed from the center of the auxiliary region selectively with respect to the material of the filling layer. The auxiliary region is subsequently patterned using the material of the planarized filling layer that covers the edge of the auxiliary region, no photomask being used. This patterning gives rise to regions which correspond to the gate regions 60 and 62 but which do not have rounded sidewalls but rather planar sidewalls which face one another. The steps for producing an optional sidewall oxide, optional extension regions, spacers and the connection region corresponding to the connection region 80 as explained with reference to FIG. 3 are then produced.

Figure 5:
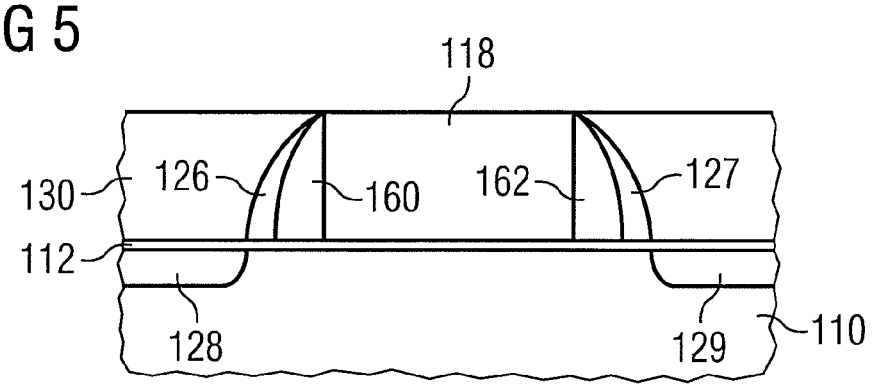
FIG. 5 shows a production stage in the production of a tunnel field-effect transistor in accordance with a second exemplary embodiment, in which a projection is produced at which gate regions are produced.

FIG. 5 shows a production stage in the production of transistors in accordance with a second exemplary embodiment. In the second exemplary embodiment, the same method steps as in the first exemplary embodiment for producing the same elements are carried out apart from the differences explained below. For differentiation, however, the elements of the second exemplary embodiment have reference symbols preceded by a 1 in comparison with identical elements of the first exemplary embodiment. By way of example, in the second exemplary embodiment a substrate 110 corresponds to the substrate 10. In the second exemplary embodiment, on an auxiliary region 118 corresponding to the auxiliary region 18, gate regions 160 and 162 are produced on the sidewalls before the spacers 126 and 127, respectively is produced. The material of the auxiliary region 118 is chosen such that it can be removed selectively with respect to the gate regions 160 and 162. By way of example, nitride is suitable as material for the auxiliary region 118. After the production of the spacers 126 and 127 a filling layer 130 composed of BSG (BoroSilicate Glass), for example, is applied. The method steps explained above with reference to FIGS. 2 to 4 are then performed, but after the removal of the auxiliary region 118, it is no longer necessary to produce gate regions within the cut-out that arises. If appropriate, only sidewall oxides and spacers are produced within the cut-out.

Figure 6:
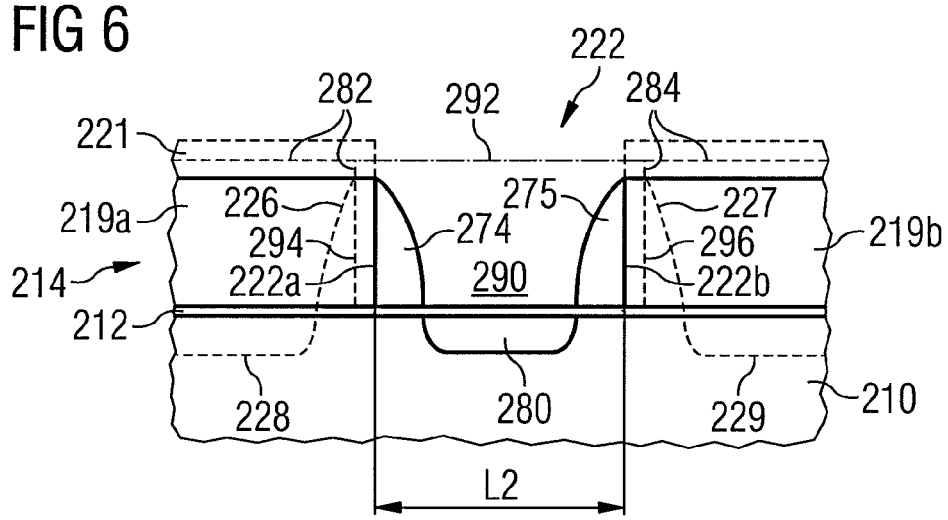
FIG. 6 shows a production stage in the production of a tunnel field-effect transistor in accordance with a third exemplary embodiment, in which a trench is produced in which no gate regions are produced.

FIG. 6 shows a production stage in the production of transistors in accordance with a third exemplary embodiment. In contrast to the first exemplary embodiment and the second exemplary embodiment, however, the two transistors are not produced on a projection, but rather in a trench 222. Once again a silicon substrate 210 is taken as a starting point, on which an insulating layer 212, for example, is optionally deposited. An auxiliary layer 214, for example composed of polycrystalline silicon and having a layer thickness of 50 nm, for example, is applied to the insulating layer 212. A trench 222 having sidewalls 222a and 222b is subsequently produced with the aid of a photolithographic method. The trench 222 has a lateral extent L2, of 150 nm, for example. When producing the trench 222, the process stops on the insulating layer 212, so that the trench bottom is situated on the insulating layer 212. After the production of the trench 222, an auxiliary region 219a arises on the left of the trench 222 and an auxiliary region 219b arises on the right of the trench 222. Spacers 274 and 275 are produced on the sidewalls 222a and 222b with the aid of a layer deposition method and an anisotropic etching process. A source/drain region 280 is then produced with the aid of an implantation method, the spacers 274, 275 and also the auxiliary regions 219a and 219b serving as a mask. The trench 222 is subsequently filled with a filling material 290, for example with the aid of BSG (BoroSilicate Glass). Planarization is subsequently effected with the aid of a CMP method (Chemical Mechanical Polishing), e.g. as far as the upper end of the spacers 274, 275.

The auxiliary regions 219a and 219b are then completely removed. A gate region 294 is subsequently produced on the left of the spacer 274, e.g. by layer deposition and anisotropic etching back. Optionally, a sidewall oxide or sidewall spacer and a further spacer 226 can then be produced on the left of the gate region 294. Likewise, a gate region 296 is produced at the same time as the gate region 294 on the right of the spacer 275. A thermal sidewall oxide and a spacer 227, or two spacers, can be produced on the right of the gate region 296. An implantation for producing connection regions or drain/source regions 228, 229 is subsequently carried out, the outer spacers and also the filling region 290 serving as a mask. Extension regions are optionally implanted or doped prior to the production of the spacers 226, 227.

In an alternative method implementation, the auxiliary regions 219a and 219b are not completely removed, but rather only in regions outside gate regions 294 and 296. In this case, the following procedure can be adopted, by way of example, a cover layer 221, for example composed of silicon nitride, is deposited jointly with the auxiliary layer 214. The trench 222 also penetrates through the silicon nitride layer 221. After the production of the spacers 274, 275 and the implantation 280, the cover layer 221 is etched back isotropically, narrow regions at the edges of the auxiliary regions 219a and 219b also being uncovered. Afterward, as explained above, the filling material 290 is introduced and planarized, see line 292, the filling material 290 also projecting somewhat over the auxiliary regions 219a and 219b. The projecting regions are used as a hard mask for patterning the regions 219a and 219b during the production of the gate regions 294 and 296, the auxiliary regions 219a and 219b only being partially removed, however. Further processing is subsequently effected as explained above, that is to say, inter alia, production of spacers 226, 227 and of connection regions 228, 229.

Figure 7:
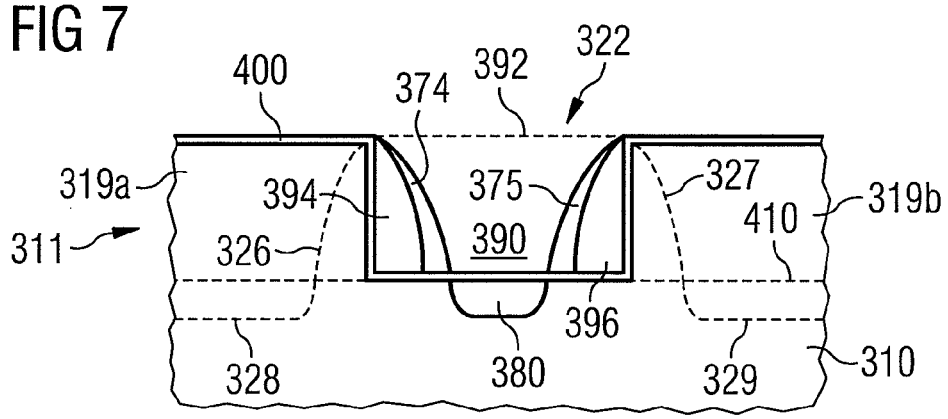
FIG. 7 shows a production stage in the production of a tunnel field-effect transistor in accordance with a fourth exemplary embodiment, in which a trench is produced in which gate regions are produced.

FIG. 7 shows a production stage in the production of transistors in accordance with a fourth exemplary embodiment. The fourth exemplary embodiment involves carrying out method steps similar to those in the third exemplary embodiment; in particular, a trench 322 is produced. However, in the trench 322, before the production of sidewall spacers 374, 375, gate regions 394, 396 are produced, for example composed of polycrystalline silicon and by means of layer deposition and anisotropic etching back. After the production of spacers 374 and 375 in the trench 322, the trench 322 is filled with a filling material 390.

In the exemplary embodiment explained with reference to FIG. 7, an insulating layer 400, for example a silicon dioxide layer, is produced on the surface of the substrate and in particular also in the trench 322, by means of thermal oxidation. Consequently, an insulating layer 212 does not need to be applied in the exemplary embodiment explained with reference to FIG. 7. This makes it possible to produce the auxiliary regions 319a and 319b in a monocrystalline substrate as well, see dashed line 410. An auxiliary layer 311 formed by the auxiliary regions 319a and 319b therefore comprises monocrystalline silicon. However, in another exemplary embodiment, an insulating layer corresponding to the insulating layer 212 is used, on which an auxiliary layer 311 is then deposited.

As also in the third exemplary embodiment, a first alternative, in the fourth exemplary embodiment, the auxiliary regions 319a and 319b are completely removed after the introduction of the filling material 390 and planarization. Sidewall oxides or further spacers 326, 327 can be produced on the uncovered sides of the gate regions 394 and 396. After the production of the sidewall oxides or the further spacers 326, 327, the optional extension regions or source/drain regions 328, 329 are produced with the aid of an implantation, the sidewall oxides or the outer spacers 326, 327 and the filling material 390 serving as a mask.

A siliciding or a selective siliciding, see FIG. 4, can also be carried out in the exemplary embodiments explained with reference to FIGS. 5 to 7.

In all the exemplary embodiments, CMOS transistors having short gate lengths and tunnel field-effect transistors having short gate lengths can be produced in the manner explained. An additional trimming mask and an additional trimming process serve for removing gate regions or spacer regions that are not required, in particular gate regions that would connect different transistors T1 and T2. By means of an additional optional step, moreover, widened connection areas in comparison with the gate regions can be produced for the gate regions.

The methods specified therefore make it possible to produce tunnel field-effect transistors without lithographic alignment problems by means of a self-aligning formation of drain and source regions. To summarize, it holds true that the miniaturization of standard CMOS transistors has encountered its physical limits. Miniaturization brings about a deterioration in the electrical properties and an increase in the leakage currents. These limitations can be avoided by the use of tunnel field-effect transistors in which further miniaturizations are possible without short channel effects and without higher leakage currents. In particular n-channel tunnel field-effect transistors with an n-doped drain and a p-doped source or substrate are suitable.

The tunnel field-effect transistors contain a pin diode that is controlled with the aid of a gate isolated from the channel forming region by an insulation region. Instead of an intrinsic region, it is also possible to use a weakly n-doped, i.e. n-doped, or a weakly p-doped, i.e. p-doped, region. An electron channel or a hole channel is formed by the application of a voltage to the gate electrode. If the charge carrier concentration in the channel reaches degeneration, a tunnel junction arises on the source side of the channel, which enables a large transistor current. Although the pn junction is reverse-biased, a current flow emerges on account of the tunnel. The methods specified are suitable in particular below the 90 nm node for tunnel field-effect transistors having lengths within the range of 20 nm to 30 nm.

In contrast to methods in which tunnel field-effect transistors would be produced with a resist on a gate region in order to produce source and drain with different doping types, the methods explained above do not exhibit any alignment problems with regard to a resist edge. The method specified here avoids the difficulty of having to position the resist mask for the connection implantation precisely on a gate region, and therefore of requiring very large gate lengths. Moreover, CMOS transistors and tunnel transistors can be produced simultaneously.

In other exemplary embodiments, additional layers are also deposited between the layers explained with reference to FIGS. 1 to 7. This is not absolutely necessary, however, so that the abovementioned layer sequences between which no further layers are situated can also be deposited.

What is claimed is:
1. A method of forming an integrated circuit comprising a tunnel transistor, the method comprising:
    forming an auxiliary layer over a substrate;
    forming at least one auxiliary region by patterning the auxiliary layer and removing material of the auxiliary layer;
    forming a first spacer element in a region in which material of the auxiliary layer has been removed;
    doping a first connection region having a first doping type of a transistor, the first spacer element and the auxiliary region serving as a mask;
    covering the first connection region with a covering material;
    removing material of the auxiliary region;
    forming a second spacer element in a region in which material of the auxiliary region has been removed;
    doping a second connection region having a second doping type of the transistor, the first doping being opposite the second doping type, the second spacer element and the covering material serving as a mask; and
    forming an extension region in only one of the first connection region or the second connection region but not the other one of the first connection region or the second connection region.
2. The method of claim 1, wherein patterning the auxiliary layer comprises forming a trench having two sidewalls facing one another.

3. The method of claim 2, wherein a minimum lateral dimension of the trench is less than 500 nanometers.

4. The method of claim 1, wherein a control region of the transistor is formed after removing material of the auxiliary region.

5. The method of claim 1, wherein forming the extension region comprises performing an additional doping step.

6. The method of claim 1, further comprising performing a silicidation process wherein only one of the first connection region or the second connection region is silicided, wherein the silicidation process is suppressed on the other one of the first connection region or the second connection region.

7. A method of forming an integrated circuit comprising a tunnel transistor, the method comprising:
   forming an auxiliary layer over a substrate;
   forming at least one auxiliary region by patterning the auxiliary layer and removing material of the auxiliary layer;
   forming a first spacer element in a region in which material of the auxiliary layer has been removed;
   doping a first connection region having a first doping type of a transistor, the first spacer element and the auxiliary region serving as a mask;
   covering the first connection region with a covering material;
   removing material of the auxiliary region;
   forming a control region of the transistor, wherein the control region of the transistor is produced before forming the first spacer element;
   forming a second spacer element in a region in which material of the auxiliary region has been removed; and
   doping a second connection region having a second doping type of the transistor, the first doping being opposite the second doping type, the second spacer element and the covering material serving as a mask.

8. The method of claim 7, wherein the first connection region and the second connection region form input/output nodes of the tunnel transistor.

9. A method of forming an integrated circuit comprising a tunnel transistor, the method comprising:
   forming an auxiliary layer over a substrate;
   forming a structured auxiliary layer having sidewalls by patterning the auxiliary layer, wherein forming the structured auxiliary layer comprises forming a projection having two sidewalls facing away from one another;
   forming a first spacer on the sidewalls of the structured auxiliary layer;
   forming a first connection region of a first doping type in the substrate using the first spacer and the structured auxiliary layer as a mask;
   covering the first connection region with a covering material;
   forming an opening by removing the structured auxiliary layer;
   forming a second spacer in the opening; and
   forming a second connection region of a second doping type in the substrate, the second spacer and the covering material as a mask, the second doping type being opposite to the first doping type, the first connection region and the second connection region being part of the tunnel transistor.

10. The method of claim 9, wherein forming a first spacer comprises forming a first layer of a semi-conductive or conductive material and forming a second layer of an insulating material over the first layer, the first layer being a control region of the transistor.

11. The method of claim 9, wherein the first connection region and the second connection region form input/output nodes of the tunnel transistor.

* * * * *